US009239892B2

(12) United States Patent
Schmidt et al.

(10) Patent No.: US 9,239,892 B2
(45) Date of Patent: Jan. 19, 2016

(54) X-RAY VISION FOR BUILDINGS

(71) Applicants: Justin Schmidt, Washington, DC (US);
Timothy Conroy, Chantilly, VA (US)

(72) Inventors: Justin Schmidt, Washington, DC (US);
Timothy Conroy, Chantilly, VA (US)

(73) Assignee: DPR CONSTRUCTION, Redwood City, CA (US)

( * ) Notice: Subject to any disclaimer, the term of this patent is extended or adjusted under 35 U.S.C. 154(b) by 47 days.

(21) Appl. No.: 14/146,176

(22) Filed: Jan. 2, 2014

(65) Prior Publication Data

US 2015/0186559 A1 Jul. 2, 2015

(51) Int. Cl.
*G06T 17/10* (2006.01)
*G06F 17/50* (2006.01)
*G06F 3/00* (2006.01)
*G06T 19/00* (2011.01)

(52) U.S. Cl.
CPC .............. *G06F 17/5004* (2013.01); *G06F 3/00* (2013.01); *G06T 19/00* (2013.01); *G06T 2210/04* (2013.01); *G06T 2219/004* (2013.01)

(58) Field of Classification Search
USPC .................................. 345/419, 420, 629, 630
See application file for complete search history.

(56) References Cited

U.S. PATENT DOCUMENTS

| | | | | |
|---|---|---|---|---|
| 2012/0019522 | A1* | 1/2012 | Lawrence et al. | 345/419 |
| 2012/0323534 | A1* | 12/2012 | Kahle et al. | 703/1 |
| 2013/0176192 | A1* | 7/2013 | Varga et al. | 345/7 |
| 2013/0300740 | A1* | 11/2013 | Snyder et al. | 345/420 |
| 2013/0335405 | A1* | 12/2013 | Scavezze et al. | 345/419 |

* cited by examiner

*Primary Examiner* — Kimbinh T Nguyen
(74) *Attorney, Agent, or Firm* — Kilpatrick Townsend & Stockton LLP

(57) ABSTRACT

Embodiments of the present invention include a method for generating a skeletal view of a building including receiving location information and spatial orientation information for a computing device. Further, a field of view may be determined based on the location information and spatial orientation information. The computing device may then receive information about a building at a location near the computing device, and identify a structure in the field of view of the computing device. Based on the information about the building, the structure, and the field of view, a graphical representation of the structure may be prepared and displayed.

24 Claims, 8 Drawing Sheets

X-RAY VISION FOR BUILDINGS

BACKGROUND OF THE INVENTION

When working with an existing building it may be difficult to work with existing elements of the building as they may be concealed behind wall covering or information about them may be otherwise unavailable. A three dimensional model may have been used to design the building before construction and a wealth of information about the components used to construct the building, their location and methods used to install them may be available in that model. Such a model may include various levels of detail, ranging from a simple rendering of the appearance of a building to a complex model including detailed descriptions of all components included in a construction project including wiring and pipes inside walls or Mechanical Electrical and Plumbing (MEP). A model of a building or construction projects may include various levels of detail for MEP information. A model may include information about the types of end-points, such as vent, electrical outlet and sink, and information about how they are connected. A more detailed model may include detailed three dimensional information about all aspects of an MEP system, including specific part numbers and a complete spatial model of all connecting wires, ducts, pipes and other components. Furthermore, parts of the building may have been scanned using a laser scannet to obtain further information about the exact position of components as they were installed.

Embodiments of the present invention provide means for using the available three dimensional model information to survey an existing building.

SUMMARY OF THE INVENTION

Embodiments of the present invention include a method for generating a skeletal view of a building. The method may include providing a computer having processor. Furthermore, location information for a computing device may be received at the computer. In addition to the location information, spatial orientation information for the computing device may be received. Based on the location information and the spatial orientation information, the processor may be used to determine a field of view for the computing device. The computing device may further receive information about a building at a location proximate to the computing device. It may then identify a structure in the field of view of the computing device. Based on the information about the building, the structure, and the field of view, the computer may then prepare a graphical representation of the structure; and display the graphical representation of the structure.

Embodiments of the invention may further include receiving an indication from a user identifying a component included in the graphical representation of the structure and displaying additional information about the component. The additional information may include one or more of the following: component dimensions, a part number for the component, and a manufacturer of the component.

In embodiments of the invention, the location information for the computing device includes GPS coordinates. In another embodiment of the invention, the location information for the computing device includes a scanned code affixed to the building. The location information for the computing device may also include image data relating to a visual marker captured by a camera connected to the computing device. In yet another embodiment of the invention, the location information for the computing device may include information about signals from WiFi access points received at the computing device. In addition to location information, spatial orientation information may be obtained from a gyroscope or from a compass.

In embodiments of the invention, the computing device is a telephone. The computing device may also be a tablet computer. The computing device may also be distributed and include multiple different types of computers, such as a tablet, a telephone and a server working together.

In embodiments of the invention, information about a building includes a three-dimensional model of at least a part of the building. The three-dimensional model may include information collected by laser-scanning. Furthermore, the information collected by laser-scanning may be combined with a to-be-constructed-model to form an as-constructed-model.

In an embodiment of the invention, the structure identified in the field of view may be a wall. Furthermore, the graphical representation of the structure may include one or more of the following: electrical wiring, ductwork, plumbing, studs, MEP components and structural support.

An embodiment of the invention includes a non-transitory computer-readable storage medium including a plurality of computer-readable instructions tangibly embodied on the computer-readable storage medium, which when executed by a data processor, provide a skeletal view of a building. The instructions may include instructions that cause the data processor to receive location information for a computing device. The instructions may further include instructions that cause the data processor to receive spatial orientation information for the computing device. Furthermore, the instructions may include instructions that cause the data processor to determine a field of view for the computing device, based on the location information and spatial orientation information. Additional instructions may cause the data processor to receive information about a building at a location proximate to the computing device; and furthermore cause the data processor to identify a structure in the field of view of the computing device. There may further be instructions that cause the data processor to prepare a graphical representation of the structure based on the information about the building, the structure, and the field of view. Embodiments of the invention may also include instructions that cause the data processor to display the graphical representation of the structure.

An embodiment of the invention may include a system for generating a skeletal view of a building. The system may include a processor; and a memory disposed in communication with the processor such that the memory stores processor executable instructions. The instructions may include instructions for receiving location information for a computing device; receiving spatial orientation information for the computing device; and instructions for determining a field of view for the computing device based on the location information and spatial orientation information. Furthermore instructions for receiving information about a building at a location proximate to the computing device and identifying a structure in the field of view of the computing device may be included. Embodiments may further include instructions causing the computing device to prepare a graphical representation of the structure based on the information about the building, the structure, and the field of view and display the graphical representation of the structure.

DETAILED DESCRIPTION OF THE INVENTION

Embodiments of the present invention include a method for generating a skeletal view of a building. The method may include providing a computer having processor. The computer may be a standalone desktop or laptop computer or any other type of computing device. In embodiments of the invention, tablet computers, mobile phones or handheld computers may be used. A person skilled in the art will appreciate that the invention is not limited to the types of computers recited above.

Figure 5:
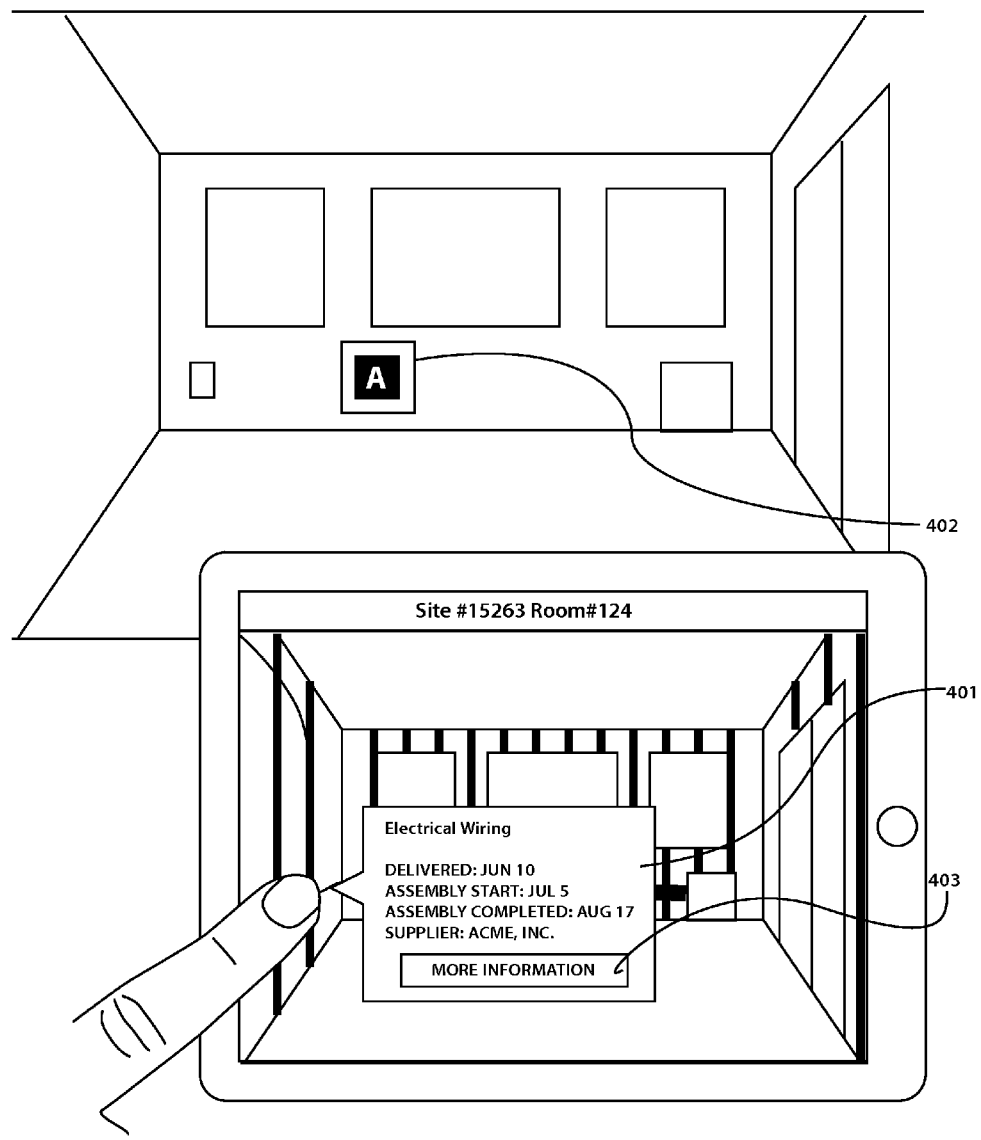
FIG. 5 shows an embodiment of the invention where three dimensional model information is combined with imaging information from the current building further showing additional information about a selected component.

Furthermore, location information for the computing device may be received at the computer. In embodiments of the invention, the invention is practiced using multiple computing devices. For example, a more powerful computer may be communicating with a tablet computer to render graphical data. A location sensor may be embedded in a tablet computer and the tablet computer may transmit that information to a server. In other embodiments, the operation is completely local. The location sensor may be a global positioning system (GPS) receiver, a Glonass receiver, or a number of other types of devices. It may be difficult to obtain a precise location when inside a building and alternative methods may be used. For example, in one embodiment, a camera may be used as a location sensor. Image data captured by the camera may be used in a number of ways to determine a location. For example, a barcode or QR code present in image data bay be used to determine the location of the computing device. Furthermore, it may be possible to analyze various elements identified in the image to determine the location of the computing device. In embodiments of the invention another type of marker may be used to determine the location and alignment of the computing device. For example, a marker with special alignment indicators may be used to precisely determine both the location of the computing device and the angle of the picture captured by the camera. An example of such a marker is shown in FIG. 5.

In yet other embodiments of the invention, the computing device may include one or more wireless network adapters, such as a WiFi interface. The computing device may receive multiple signals from WiFI base stations and triangulate the signals to determine a location for the computing device. A person skilled in the art will appreciate that the present invention is not limited to the means for determining location recited above.

In addition to the location information, spatial orientation information for the computing device may be received. The spatial orientation of the computing device may be determined using one or more accelerometers embedded in the device. In embodiments of the invention, a gyroscope may be used in place of or in addition to the accelerometer to provide more precise orientation information. In other embodiments of the invention a compass may be used.

The location information and spatial orientation information may be used to determine a field of view for the computing device. In embodiments of the invention, the field of view may include a three dimensional point location and a direction. In other embodiments, the field of view may further include additional information to enable precise alignment of objects from the three dimensional model with image data captured of the actual building using a camera attached to the computing device.

The computer may further receive information about a building at a location proximate to the computing device. The computing device may have information about the building model available locally on the device or may access such information over a computer network. Even in embodiments of the invention where the information is accessed locally on a portable device, the information may be received over a network ahead of time in order to enable access of the model where network access is not available at all or is slower. In other embodiments of the invention, a portable computer may accesses portions of the three dimensional model on the fly as information is needed. For example sections of a building-model may be downloaded as they are needed to display relevant information.

The model may include a three dimensional model used for construction. Such models may include information about particular components used in construction such as particular plumbing components, HVAC components, electrical components and other components. Depending on the detail of the model, information about studs, particular alignment of ceiling tile and location of light fixtures may be available. Such three dimensional models may be prepared using industry standard software such as Auto CAD or other custom or standard software.

In addition to a construction model, information obtained by laser scanning during or after construction may be used. This may be referred to as-constructed model. Such models may include laser scanning information from various stages of the building process and of some or all of the rooms of the building as well as for other interior and exterior spaces. In particular, a laser-scan may be conducted of rooms in the building before wall covering such as plaster or dry-wall is installed to finish the walls. Such scanning information may render a three dimensional model including information about the surface contours of the room. This may expose many components visible in the room with the open walls, such as HVAC ducts, studs, electrical wiring, plumbing and other components. The scan may however only reveals the location and contours of these components, it does not reveal what they are beyond their contours.

In embodiments of the invention, by combining the construction model and the scanning data in the as constructed model, the contour information may be matched with the component information in the construction model to provide more accurate location information for the components in the construction model and thereby provide an as-constructed model that includes the additional information about the particular components used available in the construction model.

In embodiments of the invention, the scanning data is combined with the construction model to provide an as-constructed model for the entire building. In other embodiments, the construction model and the scanning information may be accessed separately and synthesized on the fly to provide a similar result. In other embodiments, the construction model may be available from one computer, and the scanning data may be available from another one. A third, portable, computer may be used to practice the invention and it may communicate with each of the other two computers to receive the information as necessary.

In embodiments of the invention, the computer may use the field of view information and combine it with information from the three dimensional model to identify at least one structure in the field of view of the computing device. This structure may be any structure included in the three dimensional model, such as HVAC ductwork, plumbing, electrical wiring, studs or any other component. Often, more than one structure may be identified.

The number of structures to identify may vary with different embodiments of the invention. Some embodiments may allow a user to specify various parameters to control the number of elements selected. For example, if all wall coverings in a building are removed, and all structures in the identified field of view are shown, the structures may include a number of structures in rooms far away in the building. Therefore, in one embodiment of the invention, only structures inside the walls immediately surrounding the room are selected. In other embodiments, a user may be allowed to select a distance filter or select a type filter, such that only plumbing structures or only HVAC structures are selected. In yet another embodiment of the invention, only structures in the ceiling will be selected, or only components in a particular wall may be selected. A person skilled in the art will appreciate that there are a number of ways to select structures from the three dimensional model, and that the invention is not limited to the examples recited above.

Figure 1:
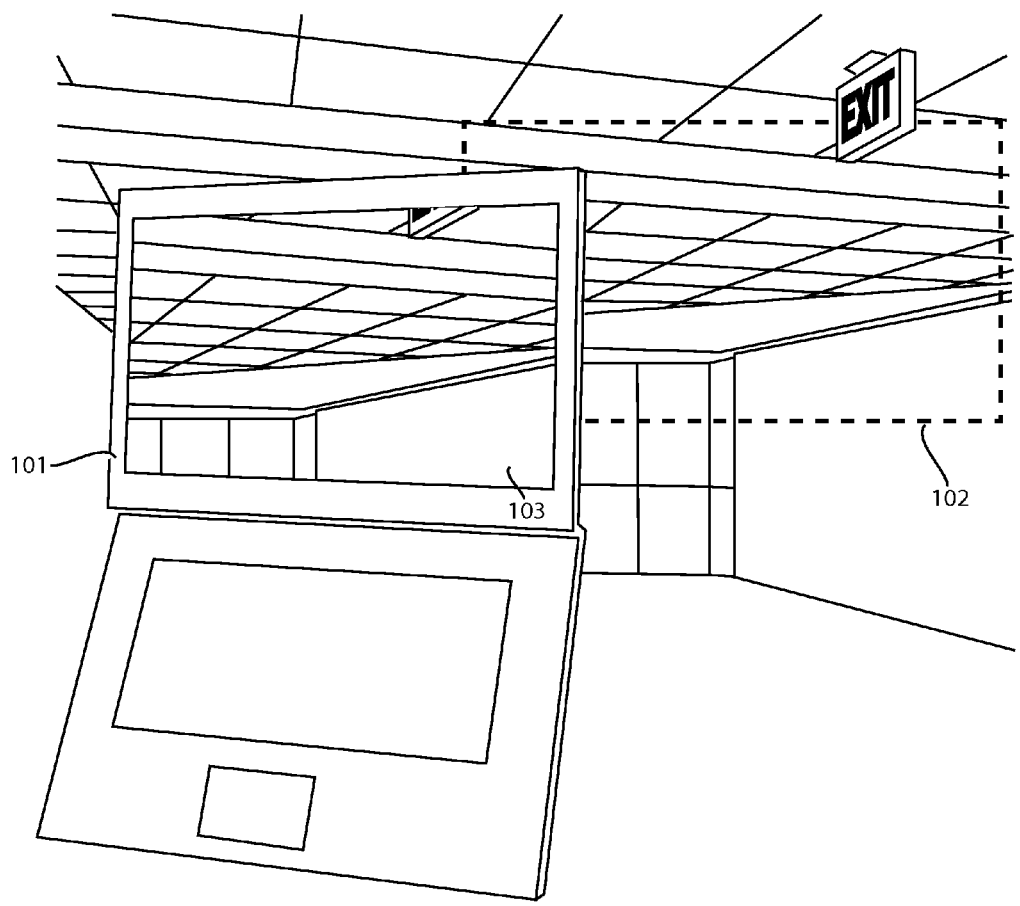
FIG. 1 shows an embodiment of the invention where imaging information from the current building is presented.
Figure 2:
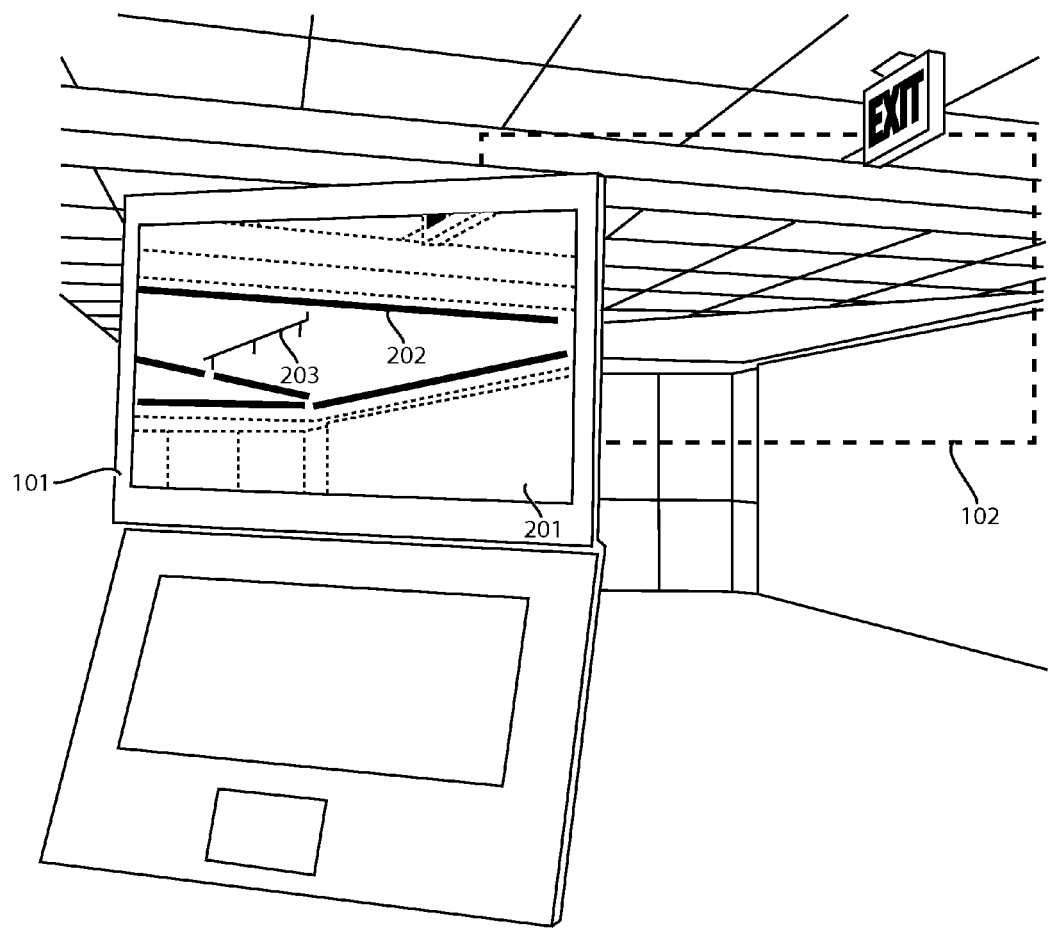
FIG. 2 shows an embodiment of the invention where three dimensional model information is combined with imaging information from the current building.
Figure 3:
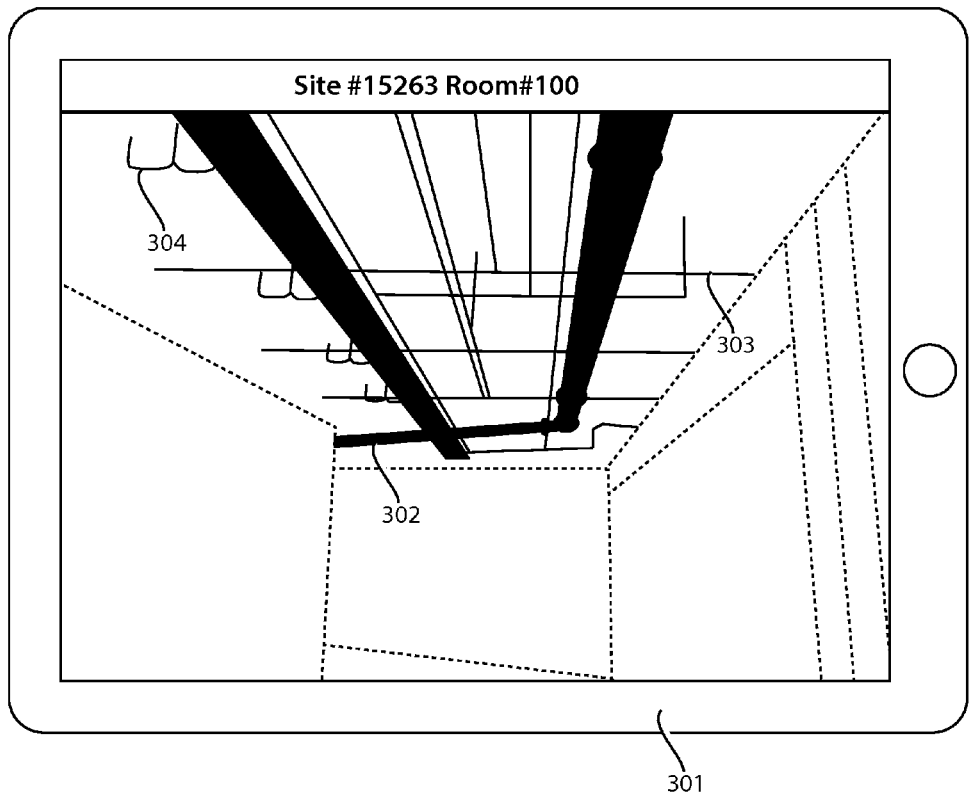
FIG. 3 shows an embodiment of the invention where three dimensional model information is combined with imaging information from the current building.
Figure 4:
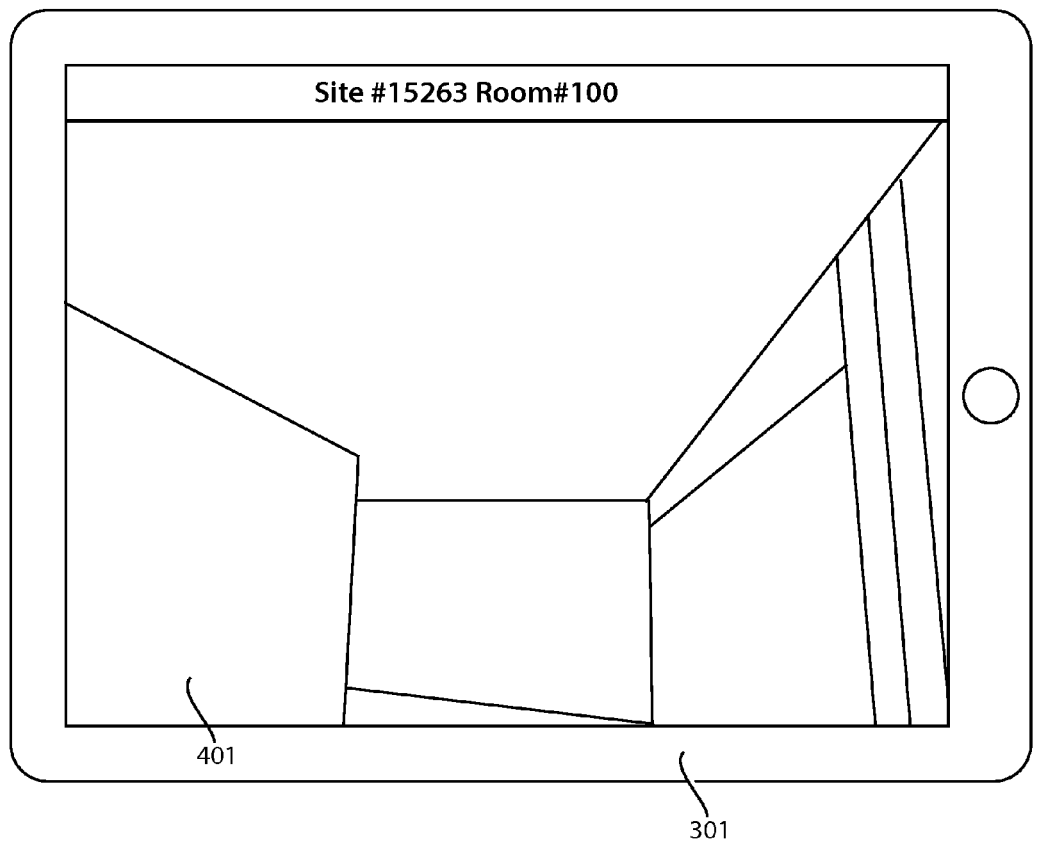
FIG. 4 shows an embodiment of the invention where imaging information from the current building is presented.

Based on the information about the building, the selected structures, and the field of view, the computer may then prepare a graphical representation of the structure. In one embodiment of the invention, only information from the three dimensional model are used to prepare the view. This may be in the form of a computerized rendering of the structures within the relevant field of view. Such a rendering is shown in FIG. 5. In another embodiment of the invention, the selected structures may be combined with imaging data from the actual building to render a combination view. Selected structured may be superimposed onto imaging or video data from a camera attached to the computing device. FIGS. 1-4 show various embodiments incorporating this functionality. In embodiments of the invention, a user may be able to select what structures to display along with the imaging data captured using the camera. FIGS. 1 and 4 show an embodiment of the invention where only the plain imaging data captured using the camera is displayed. FIGS. 2 and 3 show renderings of structures from the three dimensional model superimposed on the video data. FIG. 2 shows various structures concealed by a lowered ceiling in a room, including HVAC (202) and fire suppression (203) components. FIG. 3 shows a similar view for a hallway; the video data also includes views of an adjacent room, but no structures have been superimposed for that room, and the ceiling is displayed as captured by the camera attached to the computing device.

Referring once again to FIG. 1, an embodiment of the invention is shown running on a laptop computer. The laptop computer (101) includes a camera that captures image data in a room. The image data captured by the camera is limited by the field of view (102) of the camera. The captured image data is displayed on the computer screen (103). FIG. 2 shows an embodiment of the invention including a similar laptop computer capturing image data using an attached camera, wherein the image data is limited by the field of view shown as (102). Representations of structural components of the building concealed by the lowered ceiling are rendered on top of the image data. For example, HVAC ducts (202) and fire suppression pipes (203) are shown. FIG. 3 shows a similar implementation running on a tablet computer (301). FIG. 3 shows HVAC ductwork (302), structural support (303) and cable hooks (304). FIG. 4 shows the same room displayed on the tablet computer (301), but with only the captured image data and without the rendered structural components.

FIG. 5 shows an embodiment of the invention running on a tablet computer. The tablet computer is pointed at a room including a marker indicator (402) on the back wall of the room. Captured image data including the marker may be used to determine which room is being captures. A rendering of the room including support beams and electrical wiring is shown. In FIG. 5, a user has pressed a graphical rendering of an electrical wire to obtain more information about the it. In response a dialog box (401) showing additional information about the wire appears. Furthermore, the user can click a button (403) to obtain further detailed information.

In embodiments of the invention, the graphical display may be generated for a single frame as captured by a user. For example, the user may snap a picture of a particular view in the room, and structures from the three dimensional model may be added to the single frame after capture. When limited computing power is available, or a very high-quality rendering is required this may be preferred. In other embodiments of the invention, a live video may be generated to generate a view that tracks the point of view of the computing device.

The graphical representation may be generated on the computing device or using the assistance of one or more remote computers. For example, a mobile computing device may submit a video feed to a server and receive video information with additional elements from the three dimensional model back from the server. The server may prepare the rendering locally or use a computing grid or other resources to render the new display. In another embodiment, the server prepares video data including only the additional elements from the three dimensional model and an additional transparency mask for the video such that it may be rendered on top of the video from the camera attached to the computing device. This may allow for quicker rendering and eliminate the need to transmit video from the portable computing device to the server. In embodiments the portable computing device transmits only the field of view information to the server.

In certain embodiments prepared renderings may be used to accelerate the display. For example pre-renderings of layers of the three dimensional model may be prepared for various types of components and for various pre-selected fields of view. For example, a rendering layer for plumbing and different ones for electrical and HVAC may be prepared. A number of these may be superimposed based on preferences selected by the user minimizing the need for on-the-fly rendering of 3D graphics.

In other embodiments of the invention, three dimensional model data may be transmitted to the portable computing device and the relevant structures from the model may be rendered on the device using its central processor or dedicated graphics rendering hardware. The model data may be preprocessed to enable faster rendering on the portable device. For example, a construction model or as-constructed model may include sufficient information to construct the building. This may require significantly more data than what is necessary to prepare a representative display of the relevant structures. For example, the structures may be simplified by removing shading information, material information, and shapes may be simplified into basic polygons that can be rendered more quickly. Furthermore, information in the model may be converted into a format that can be sent to the graphical rendering hardware of the device or rendering APIs available on the device with little or no modifications. In embodiments of the invention, various pre-prepared versions of a model may be maintained on a server to enable rapid rendering on multiple devices. For example, one set of pre-prepared data may be maintained for iOS devices, and one set of pre-prepared data may be maintained for Android devices. A person skilled in the art will be familiar with a number of ways of optimizing three dimensional model data to enable rapid rendering of the data on a mobile device, and will appreciate that the present invention is not limited to the examples recited above.

In embodiments of the invention, where data is transmitted live to a portable computing device, the transmission and rendering methods may be adjusted on the fly to adapt to available bandwidth. For example, if a low-latency, high-bandwidth connection is available a richer experience may be provided as transmission of video data to the server and receipt of detailed video data or three dimensional model data to the device from the server may be possible with little delay. If a lower-speed and/or higher latency connection is used less detailed information may be transmitted to the device, and the rendering may be paused until sufficient model data is transmitted to the device to enable on-device rendering to minimize latency for a changed field of view.

The computing device may display a graphical representation of the structure. In an embodiment of the invention, the rendering may be displayed full screen on the device. In other embodiments, the view may be supplemented with options to customize the view, such as by selecting which structures to include an not. Furthermore, the user may be given the option to highlight certain structures, and color-code them to give them special visibility. In embodiments of the invention various pre-defined color schemes may be available to the user, to code certain components in certain ways. Furthermore, filtering options may be available for the video data that may be combined with the rendering. For example the video data may be shown in black and white such that color coded structures from the three dimensional model can be more easily distinguished from the video data.

In embodiments of the invention, a user may be able to freeze the view of the device to manipulate it further. For example, the user may be able to move the device around to obtain a desired field of view, and then freeze the view to further interact with the device in a more convenient location without changing the view displayed on the device. In a further embodiment of the invention multiple computing devices may be used to view or interact with the display. For example, a second device may display a mirror view of the view provided by the first device. It may be convenient for one person to use a telephone device to determine a point of view, while a second person views the same view on a larger device such as a desktop computer or an iPad. Furthermore one computing device may be used to view the graphical rendering while another device is used to input parameters for the display. For example, a second device may be used to specify various changes to the view, such as what structures to include or what filters to apply to the video data. Furthermore, a computing device may be used to specify a field of view manually rather than relying on sensors. A user may be able to select a building and a room from a menu and select a point of view manually using a touch screen or a mouse. For example, a user may be able to drag their finger across a touch screen to change the angle rendered.

Embodiment of the invention may further include receiving an indication from a user identifying a component included in the graphical representation of the structure and displaying additional information about the component. For example, if the computing device has a touch screen, the user may touch a particular structure to obtain additional information about it. If a standard computer is used, a mouse may be used. Embodiments may allow a user to zoom in to allow for easier selection of components, or allow a user to remove certain components from a view to enable selection of components behind them. In embodiments of the invention, a menu is presented to a user when the user points to an area of the screen that could correspond to multiple components.

The additional information displayed may include one or more of the following: component dimensions, a part number for the component, and a manufacturer of the component. The display may also include information about the installation, such as a particular person who installed the component or what batch it was delivered from. Furthermore, any discrepancies between the planned installation and the actual installation detected by laser scanning may be showed. For example, this may include an indication that the component was installed 3 inches further to the left than planned.

In embodiments of the invention, the user may also probe to see if it is safe to install certain extra components, such as attaching hooks at a certain location on the wall, or removing a structure, or adding load to an electrical circuit.

In embodiments of the invention, the location information for the computing device includes GPS coordinates. In another embodiment of the invention, the location information for the computing device includes a scanned code affixed to the building. The location information for the computing device may also include image data relating to a visual marker captured by a camera connected to the computing device. In yet another embodiment of the invention, the location information for the computing device may include information about signals from WiFi access points received at the computing device. In addition to location information, spatial orientation information may be obtained from a gyroscope or from a compass.

In embodiments of the invention, the computing device comprises a smartphone or other telephone device. The computing device may also include a tablet computer or a hybrid tablet-phone device.

In embodiments of the invention, information about a building includes a three-dimensional model of at least a part of the building. The three-dimensional model may include information collected by laser-scanning. As described above, the construction model may be corrected or modified based on the laser scanning data.

In an embodiment of the invention, the structure identified in the field of view may be a wall. Furthermore, the graphical representation of the structure may include one or more of the following structures: electrical wiring, ductwork, plumbing, studs, MEP components, structural support, and the like.

An embodiment of the invention includes a non-transitory computer-readable storage medium including a plurality of computer-readable instructions tangibly embodied on the computer-readable storage medium, which when executed by a data processor, provide a skeletal view of a building. The storage medium may include a hard-disk, solid state drive, compact disk, memory stick or any other such device. The instructions may include instructions that cause the data processor to receive location information for a computing device.

The instructions may further include instructions that cause the data processor to receive spatial orientation information for the computing device. Furthermore, the instructions may include instructions that cause the data processor to determine a field of view for the computing device, based on the location information and spatial orientation information. Additional instructions may cause the data processor to receive information about a building at a location proximate to the computing device; and furthermore cause the data processor to identify a structure in the field of view of the computing device. There may further be instructions that cause the data processor to prepare a graphical representation of the structure based on the information about the building, the structure, and the field of view. Embodiments of the invention may also include instructions that cause the data processor to display the graphical representation of the structure.

An embodiment of the invention may include a system for generating a skeletal view of a building. The system may include a processor; and a memory disposed in communication with the processor such that the memory stores processor executable instructions. The instructions may include instructions for receiving location information for a computing device; receiving spatial orientation information for the computing device; and determining a field of view for the computing device based on the location information and spatial orientation information. Furthermore instructions for receiving information about a building at a location proximate to the computing device and identifying a structure in the field of view of the computing device may be included. Embodiments may further include instructions causing the computing device to prepare a graphical representation of the structure based on the information about the building, the structure, and the field of view and display the graphical representation of the structure. The computing device may further include a network interface. The network interface may include a WiFi adapter and/or a wired ethernet adapter. The network interface may also include a cellular modem such as a 3G or 4G modem.

Figure 6:
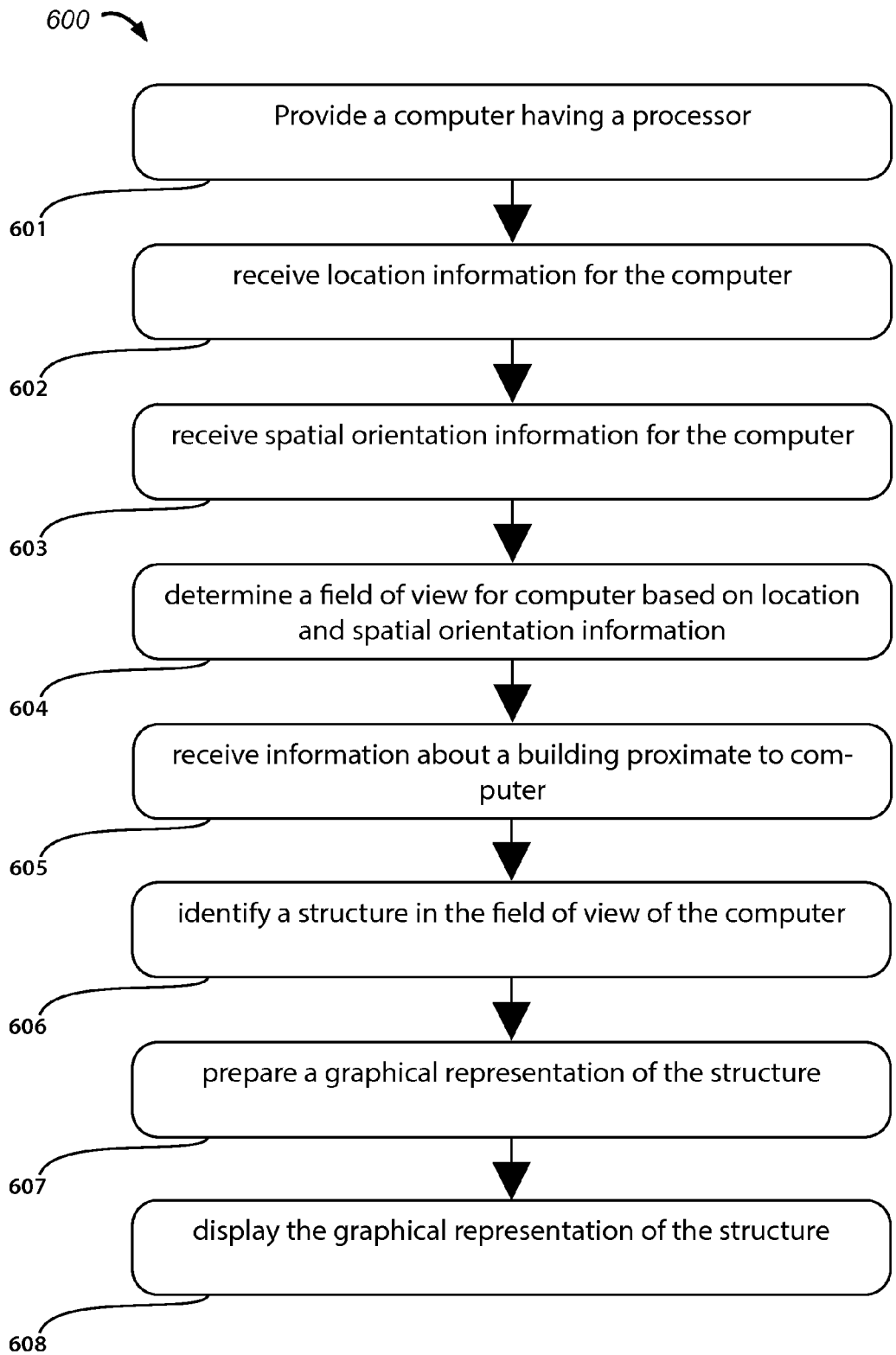
FIG. 6 is a high-level flowchart illustrating a method for generating a skeletal view of a building.

FIG. 6 is a simplified flowchart illustrating a method for generating a skeletal view of a building according to an embodiment of the present invention. The method 600 includes providing a computer having a processor (601); receiving location information for the computer (602); receiving spatial orientation information for the computer (603); and determining a field of view for the computer based on the location and spatial orientation information (604). The method further includes receiving information about a building proximate to the computer (605) and identifying a structure in the field of view of the computer (606). Furthermore, the method includes preparing a graphical representation of the structure (607) and displaying that graphical representation.

It should be appreciated that the specific steps illustrated in FIG. 6 provide a particular method for generating a skeletal view of a building. Other sequences of steps may also be performed according to alternative embodiments. For example, alternative embodiments of the present invention may perform the steps outlined above in a different order. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 7:
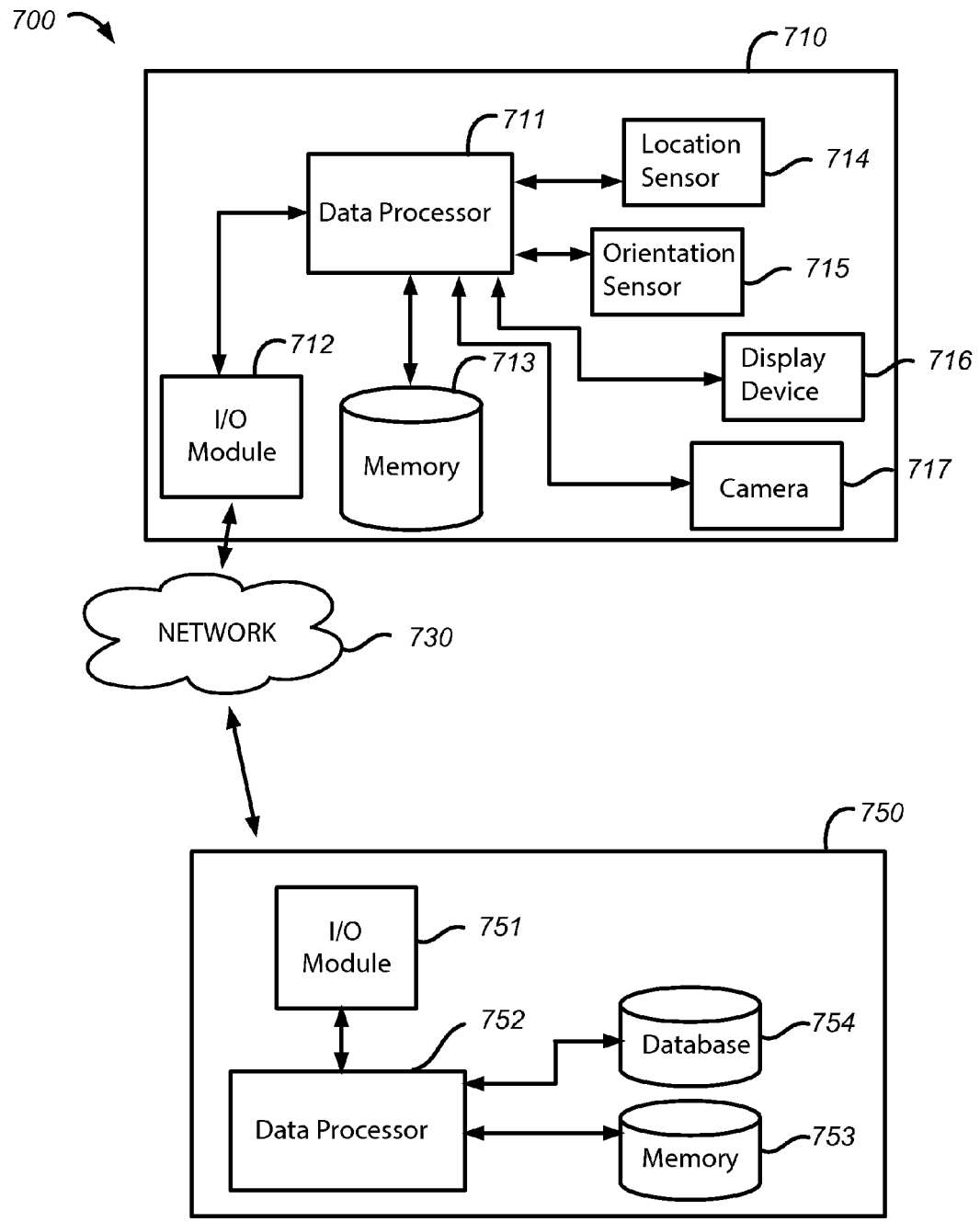
FIG. 7 is a high-level schematic diagram illustrating a system for generating a skeletal view of a building according to an embodiment of the present invention.

FIG. 7 is a simplified schematic diagram of a system for generating a skeletal view of a building according to an embodiment of the present invention. As illustrated in FIG. 7 computer 710 can include one of many types of computing devices including, without limitation, a personal computer, a laptop computer, a notebook computer, a tablet computer, a handheld mobile device, a PDA, a mobile phone, or the like. The computer 710 includes a data processor 711, and a memory 713. The computer further includes a location sensor 714, an orientation sensor 715, a display device 716 and a camera 717. The computer also includes an I/O module 712 that may be used to communicate over a network 730 with a computer 750 including a database 754. There may be one or more such computers with databases. The second computer also includes a data processor 752, a memory 753 and an I/O module 751.

Figure 8:
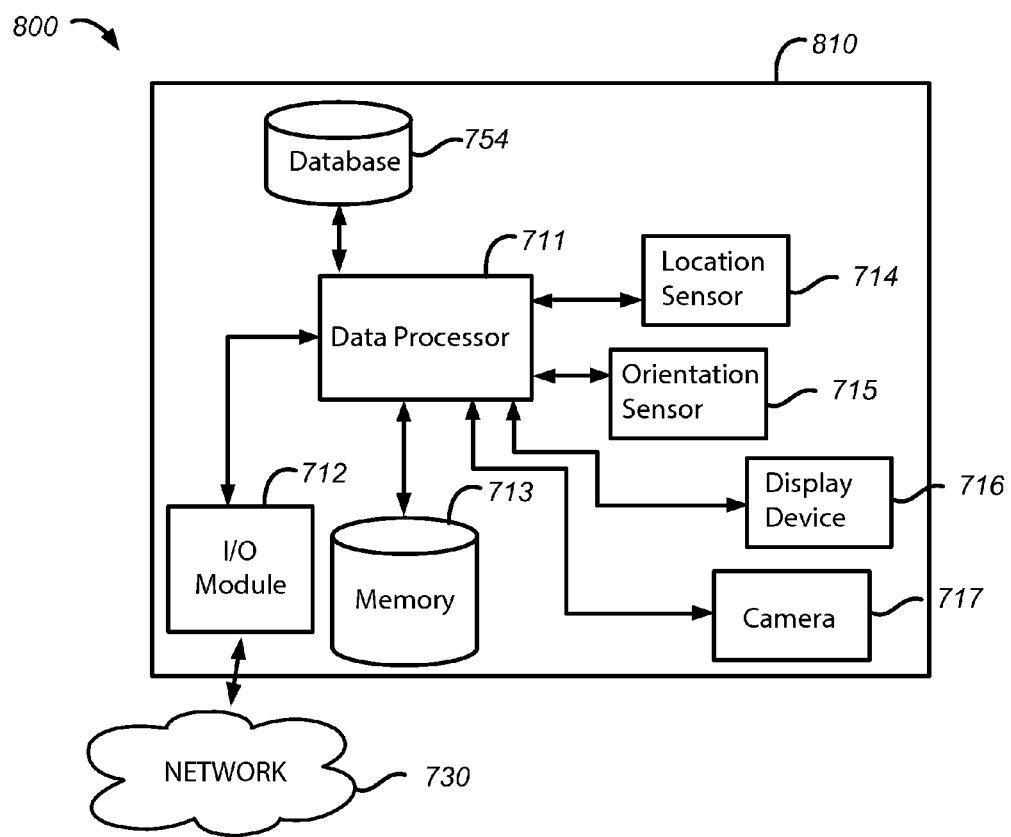
FIG. 8 is a high-level schematic diagram illustrating a system for generating a skeletal view of a building according to an embodiment of the present invention.

FIG. 8 is a simplified schematic diagram of a system for generating a skeletal view of a building according to an embodiment of the present invention. As illustrated in FIG. 8 computer 810 can include one of many types of computing devices including, without limitation, a personal computer, a laptop computer, a notebook computer, a tablet computer, a handheld mobile device, a PDA, a mobile phone, or the like. The computer 810 includes a data processor 711, and a memory 713. The computer further includes a location sensor 714, an orientation sensor 715, a display device 716 and a camera 717. The computer 810 also includes a database 754. The computer also includes an I/O module 712 that may be used to communicate over a network 730.

The foregoing detailed description has set forth various embodiments of the systems and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

What is claimed is:

1. A method for generating a skeletal view of an existing building in view of a computing device having a camera, the skeletal view being a representation of hidden structural components and visible structural components of the existing building, the method comprising:
   receiving, via a processor, location information associated with the computing device, the location information identifying a physical location of the computing device;
   receiving spatial orientation information for the computing device, the spatial orientation information identifying a physical orientation of the computing device;
   determining a field of view for the computing device using the location information and the spatial orientation information, the field of view including a three-dimensional (3D) location of the computing device and a direction of view from the camera of the computing device;
   receiving three-dimensional (3D) model information representing construction details of the existing building, the existing building being at a location proximate to the computing device, and the 3D model information including the hidden structural components and the visible structural components;

comparing the field of view with the 3D model information;

identifying a hidden structural component based on the comparison between the field of view and the 3D model information, the hidden structural component being hidden within at least one of a wall, a ceiling or a floor of the existing building;

preparing a composite representation including a visible structural component and the hidden structural component; and displaying the composite representation on the computing device.

2. The method of claim 1 further comprising receiving an indication from a user identifying the hidden structural component included in the composite representation and displaying additional information about the hidden structural component, including one or more of the following: component dimensions, a part number for the component, and a manufacturer of the component.

3. The method of claim 1 wherein the location information associated with the computing device comprises GPS coordinates or a scanned code affixed to the existing building.

4. The method of claim 1 wherein the location information associated with the computing device comprises image data relating to a visual marker captured by the camera of the computing device.

5. The method of claim 1 wherein the location information associated with the computing device comprises information about signals from WiFi access points received at the computing device.

6. The method of claim 1 wherein the spatial orientation information comprises information from a gyroscope or a compass.

7. The method of claim 1 wherein the computing device comprises a telephone.

8. The method of claim 1 wherein the computing device comprises a tablet computer.

9. The method of claim 1 further comprising, receiving a user selection of a type of hidden structural component, and preparing the composite representation to include the selected type of hidden structural component and exclude other non-selected types of hidden structural components.

10. The method of claim 8 wherein the three-dimensional model comprises information collected by laser-scanning.

11. The method of claim 10 wherein the information collected by laser-scanning is combined with a to be constructed model to form an as constructed model.

12. The method of claim 1 wherein the visible structural component comprises a wall.

13. The method of claim 1 wherein the hidden structural component comprises one or more of the following: electrical wiring, ductwork, plumbing, studs, MEP components and structural support hidden within at least one of a wall, a ceiling or a floor of the existing building.

14. A non-transitory computer-readable storage medium comprising a plurality of computer-readable instructions tangibly embodied on the computer-readable storage medium, which when executed by a data processor, provide a skeletal view of an existing building in view of a computing device having a camera, the skeletal view being a representation of hidden structural components and visible structural components of the existing building, the plurality of instructions comprising:

instructions that cause the data processor to receive location information associated with the computing device, the location information identifying a physical location of the computing device;

instructions that cause the data processor to receive spatial orientation information for the computing device, the spatial orientation information identifying a physical orientation of the computing device;

instructions that cause the data processor to determine a field of view for the computing device, based on the location information and spatial orientation information, the field of view including a three-dimensional (3D) location of the computing device and a direction of view from the camera of the computing device;

instructions that cause the data processor to receive three-dimensional (3D) model information representing construction details of the existing building, the existing building being at a location proximate to the computing device, and the 3D model information including the hidden structural components and the visible structural components;

instructions that cause the data processor to compare the field of view with the 3D model information;

instructions that cause the data processor to identify a hidden structural component based on the comparison between the field of view and the 3D model information, the hidden structural component being hidden within at least one of a wall, a ceiling or a floor of the existing building;

instructions that cause the data processor to, generate a composite representation including visible structural components of the existing building and the hidden structural component; and instructions that cause the data processor to display the composite representation on the computing device.

15. The non-transitory computer-readable storage medium of claim 14 further comprising instructions that cause the data processor to receive an indication from a user identifying a hidden structural component included in the composite representation and displaying additional information about the hidden structural component, including one or more of the following: component dimensions, a part number for the component, and a manufacturer of the component.

16. The non-transitory computer-readable storage medium of claim 14 wherein the location information associated with the computing device comprises information about signals from WiFi access points received at the computing device.

17. The non-transitory computer-readable storage medium of claim 14 wherein the computing device comprises a tablet computer.

18. The non-transitory computer-readable storage medium of claim 14 wherein the composite representation includes image data of the visible structural component captured by the camera, and computer-generated graphics representing the hidden structural component.

19. A system for generating a skeletal view of an existing building in view of a computing device having a camera, the skeletal view being a representation of hidden structural components and visible structural components of the existing building, the system comprising:

a processor; and a memory disposed in communication with the processor and storing processor executable instructions, the instructions comprising instructions for:

receiving location information associated with the computing device, the location information identifying a physical location of the computing device;

receiving spatial orientation information for the computing device, the spatial orientation information identifying a physical orientation of the computing device;

determining a field of view for the computing device using the location information and the spatial orientation information, the field of view including a three-dimensional (3D) location of the computing device and a direction of view from the camera of the computing device;

receiving three-dimensional (3D) model information representing construction details of the existing building, the existing building being at a location proximate to the computing device;

comparing the field of view with the 3D model information;

identifying a hidden structural component based on the comparison between the field of view and the 3D model information, the hidden structural component being hidden within at least one of a wall, a ceiling or a floor of the existing building;

preparing a composite representation including a visible structural component and the hidden structural component; and displaying the composite representation on a display of the system.

20. The system of claim 19 wherein the instructions further comprise instructions for receiving an indication from a user identifying the hidden structural component included in the composite representation and displaying additional information about the hidden structural component, including one or more of the following: component dimensions, a part number for the component, and a manufacturer of the component.

21. The system of claim 19 wherein the location information associated with the computing device comprises information about signals from WiFi access points received at the computing device.

22. The system of claim 19 wherein the computing device comprises a tablet computer.

23. The system of claim 19 wherein the 3D model information comprises a three-dimensional model of at least a part of the existing building.

24. The method of claim 1, wherein comparing the field of view with the 3D model information comprises aligning the 3D model with the 3D location and the direction of view to identify the hidden structural component.

* * * * *